(12) United States Patent
Lee et al.

(10) Patent No.: US 7,318,532 B1
(45) Date of Patent: Jan. 15, 2008

(54) SLAM LATCH FOR RACKMOUNT RAIL

(75) Inventors: Daniel Z. Lee, Redwood City, CA (US); Arthur S. Brigham, Sunnyvale, CA (US); William R. Jones, III, San Francisco, CA (US); Joel F. Jensen, Redwood City, CA (US); Denise R. Silverman, San Carlos, CA (US); Christopher H. Frank, San Jose, CA (US); Sarah Aquino, Newark, CA (US); Robert F. Mori, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 69 days.

(21) Appl. No.: 10/968,686

(22) Filed: Oct. 19, 2004

(51) Int. Cl.
  *H05K 5/00* (2006.01)
  *H05K 7/14* (2006.01)
  *A47F 7/00* (2006.01)

(52) U.S. Cl. .................. 211/26; 248/222.13; 312/333; 361/727; 403/326; 403/379.5

(58) Field of Classification Search .................. 211/26, 211/26.2, 4; 312/222, 333, 332.1, 223.1, 312/334.4, 334.44; 361/727; 403/321, 378, 403/324–328, 379.5
See application file for complete search history.

(56) References Cited

U.S. PATENT DOCUMENTS

| | | | |
|---|---|---|---|
| 3,367,732 A | * | 2/1968 | Beye ........................ 312/332.1 |
| 4,006,951 A | * | 2/1977 | Geer et al. ................ 312/332.1 |
| 4,365,831 A | | 12/1982 | Bourne |
| 4,693,503 A | | 9/1987 | Bisbing |
| 4,761,092 A | * | 8/1988 | Nakatani ..................... 403/104 |
| 4,979,909 A | * | 12/1990 | Andrews ..................... 439/352 |
| 5,226,828 A | | 7/1993 | Fietz |
| 5,417,012 A | | 5/1995 | Brightman et al. |
| 5,540,515 A | * | 7/1996 | Rock et al. ............... 403/322.4 |
| 5,664,813 A | | 9/1997 | Gromotka |
| 5,868,261 A | | 2/1999 | Collins et al. |
| 5,946,186 A | | 8/1999 | Karl et al. |
| 6,169,653 B1 | | 1/2001 | Engel |
| 6,209,979 B1 | * | 4/2001 | Fall et al. ................. 312/330.1 |
| 6,230,903 B1 | * | 5/2001 | Abbott ........................ 211/26 |
| 6,246,576 B1 | | 6/2001 | Sands et al. |
| 6,269,959 B1 | | 8/2001 | Haworth |

(Continued)

*Primary Examiner*—James A. Kramer
*Assistant Examiner*—Jared W. Newton
(74) *Attorney, Agent, or Firm*—Meyertons Hood Kivlin Kowert & Goetzel, P.C.; B. Noël Kivlin; Chris D. Thompson

(57) ABSTRACT

A rackmount system for a component may include outer slide members that couple with inner slide members. The outer slide members may be coupled to a rack with slam latches. The slam latches may couple with rails of the rack when the slam latches are placed against the rails. The inner slide members may be coupled to a component. The inner slide members may include tabs that engage slots in a chassis of the component to couple the inner slide members to the component. An inner slide assembly may include an inner latch that couples with the outer slide member to inhibit movement of the inner slide member relative to the outer slide member. The rackmount system may include a locking mechanism that locks the component relative to the rack.

21 Claims, 10 Drawing Sheets

U.S. PATENT DOCUMENTS

| | | |
|---|---|---|
| 6,288,902 B1 | 9/2001 | Kim et al. |
| 6,601,713 B2 * | 8/2003 | Kaminski .................... 211/26 |
| 6,637,847 B2 | 10/2003 | Crisp et al. |
| 6,641,182 B2 | 11/2003 | Schlack et al. |
| 6,702,124 B2 * | 3/2004 | Lauchner et al. ............. 211/26 |
| 6,749,275 B2 * | 6/2004 | Cutler et al. ............. 312/334.4 |
| 6,764,149 B2 * | 7/2004 | Jurja ......................... 312/333 |
| 6,773,080 B2 * | 8/2004 | Chen et al. ............. 312/265.1 |
| 6,795,307 B2 | 9/2004 | Arbogast et al. |
| 6,891,727 B2 * | 5/2005 | Dittus et al. ................. 361/724 |
| 6,948,691 B2 * | 9/2005 | Brock et al. ........... 248/222.13 |
| 2003/0213757 A1 | 11/2003 | Rumney |
| 2004/0189021 A1 | 9/2004 | Eckerdt |
| 2004/0209502 A1 | 10/2004 | Siahpolo et al. |
| 2005/0156493 A1 * | 7/2005 | Yang et al. .............. 312/334.5 |

* cited by examiner

SLAM LATCH FOR RACKMOUNT RAIL

BACKGROUND OF THE INVENTION

1. Field of the Invention

This invention relates generally to electronic equipment, such as computers, and, more particularly, to apparatus for mounting electronic equipment in racks.

2. Background Information

Electronic systems such as computers are typically constructed in a modular fashion. Large systems such as servers may include multiple components installed in a rack. As used herein, "component" includes any of various elements or systems of equipment, including, but not limited to, circuit cards, disk drives, or power supplies. Electronic elements of a component are commonly housed in chassis or other enclosures. As used herein, "rack" or "rack assembly" includes any assembly or structure adapted to receive or house a component.

Components may be installed in racks using slide assemblies. Typically, a pair of outer slides is installed on vertical rails on the interior sides of the rack, and a pair of complementary inner slides is installed on the exterior sides of the component. As the component is advanced in the rack, the inner slides on the component engage the outer slides on the rack such that the component is supported on the slide assemblies.

Outer slides are commonly attached at front and rear rails of a rack using screws. To install the screws, users may be forced to maintain uncomfortable positions in cramped quarters for extended periods of time. Generally, a user must ensure that the slide assemblies are level front-to-back, which may be made difficult due to space limitations and a lack of easily read position markers. Using screws also requires a hand tool (e.g., a screwdriver) during installation. Screws are frequently dropped and lost during the installation process.

Screws for outer slides may be initially left loose to allow the outer slides to move slightly to accommodate tolerances in various elements of the system (e.g., misalignment of the inner slides, misalignment of screw holes in opposing rack rails). After the component is installed, the screws for the outer slides are to be fully tightened. Leaving the screws loose may create a dangerous work environment, as the relatively heavy equipment is under-supported during installation. In addition, users may forget to tighten the screws after the component is installed.

Screws are also commonly used for attaching the inner slides to the component. In some cases, there are "extra" holes in the component chassis, so that the desired mounting location is not clear to the user. Also, the installation process requires a hand tool to tighten the screws.

Many components for servers are heavy, and installation of such components is often a two-person job. One person carries the component and engages the inner slide on one side of the component with its mating outer slide on the rack. A second person then pulls the equipment into alignment with the other (loosely mounted) outer slide and helps guide the equipment into the rack. Because the equipment is heavy and often must be installed at an awkward height, this installation step sometimes results in damage to the slides (and to the equipment if dropped). Also, in some cases, the fixturing method used to secure the equipment in place is not robust enough to withstand large magnitude shock or vibration loads (e.g., as may be experienced in earthquakes).

SUMMARY OF THE INVENTION

In an embodiment, a system for mounting a component in a rack may include complementary outer and inner slide members. The outer slide members may couple with the rack. The inner slide members may couple with the component. In some embodiments, outer slide assemblies and inner slide assemblies may be coupled to the rack and component, respectively, without the use of any hand tools.

In an embodiment, an outer slide assembly may include a slam latch for coupling an outer slide member with the rack. The slam latch may automatically close when the slam latch is placed on a rack rail. An engaging member of the slam latch may engage a portion of the rack rail to couple the slam latch with the rack rail. The engaging member may maintain the outer slide assembly at a desired height with respect to the rack rail.

In an embodiment, a latch may include a cocking element. The cocking element may hold an engaging member of the latch in an open position when the latch is initially positioned on a portion of a rack. The engaging member may be released when the cocking element is displaced to a predetermined position to secure the latch to the rack rail. In one embodiment, the cocking element may be an armature. The armature may sequentially cock and release the engaging member as the latch is placed against a rack rail.

In an embodiment, a latch on an outer slide assembly may include an aligning portion. The aligning portion may orient an outer slide member at desired angle relative to a rack rail. In one embodiment, the aligning portion may be a channel that receives a portion of a rack rail to orient an outer slide member. The aligning portion may orient the outer slide member in a direction perpendicular to the rack rail.

In an embodiment, a body of a latch may be allowed to float laterally with respect to an outer slide member. In one embodiment, a bracket for a latch may be secured to an outer slide member. The body of the latch may be pinned to the bracket through a slot in the body. The slot in the body may be wider than the bracket such that the body can move laterally on the bracket. The body may be adjusted during installation of the slide assembly and/or component to account for tolerances in the rack.

A latch may include a release for removing the latch from a rack rail. In one embodiment, latches on both ends of a slide assembly may include releases. A user may simultaneously actuate the releases to remove the slide assembly from a pair of rack rails. In certain embodiments, the releases may be inaccessible to a user when the component is installed in the rack.

In an embodiment, an inner slide member may include one or more tabs. The tabs may engage slots in a chassis of a component to couple the inner slide member to the component. In certain embodiments, a resilient member (e.g., a leaf spring) on the inner slide member may engage in an aperture of the chassis to inhibit axial movement of the inner slide member relative to the component.

In an embodiment, an inner slide assembly for a component may include an inner latch. The inner latch may couple with a portion of an outer slide assembly on a rack to inhibit separation of the component from the rack. In one embodiment, the inner slide latch may couple with elements of a slam latch on an outer slide assembly.

In an embodiment, a rackmount system for a component may include a locking mechanism. The locking mechanism may include a locking member that is operated by a user to lock the component relative to the rack. In some embodiments, the locking member may be integrated with another element of the rackmount system (e.g., an inner slide assembly). In one embodiment, the locking member may be a lever having a cam portion. The cam portion may force a pin against a portion of a rack rail when the lever is operated.

In some embodiments, a locking member of a locking mechanism may include a handle portion. The handle portion may allow a user to lock and release the locking mechanism without using a tool. The handle portion may be operable to manually position a component in a rack.

In an embodiment, an inner slide member of a rackmount system for a component may include a shelf member. The shelf member may be used as a guide to align an inner slide member with a respective outer slide member. The shelf member may engage a portion of an outer slide member as the component is initially positioned for installation in the rack. In one embodiment, a user may engage a shelf member on one side of a component to partially support the component. While the component is partially supported by the shelf member, the user may align an inner slide member on the other side of the component with a respective outer slide member on the rack.

BRIEF DESCRIPTION OF THE DRAWINGS

Other aspects of the invention will become apparent upon reading the following detailed description and upon reference to the accompanying drawings in which.

Figure 1:
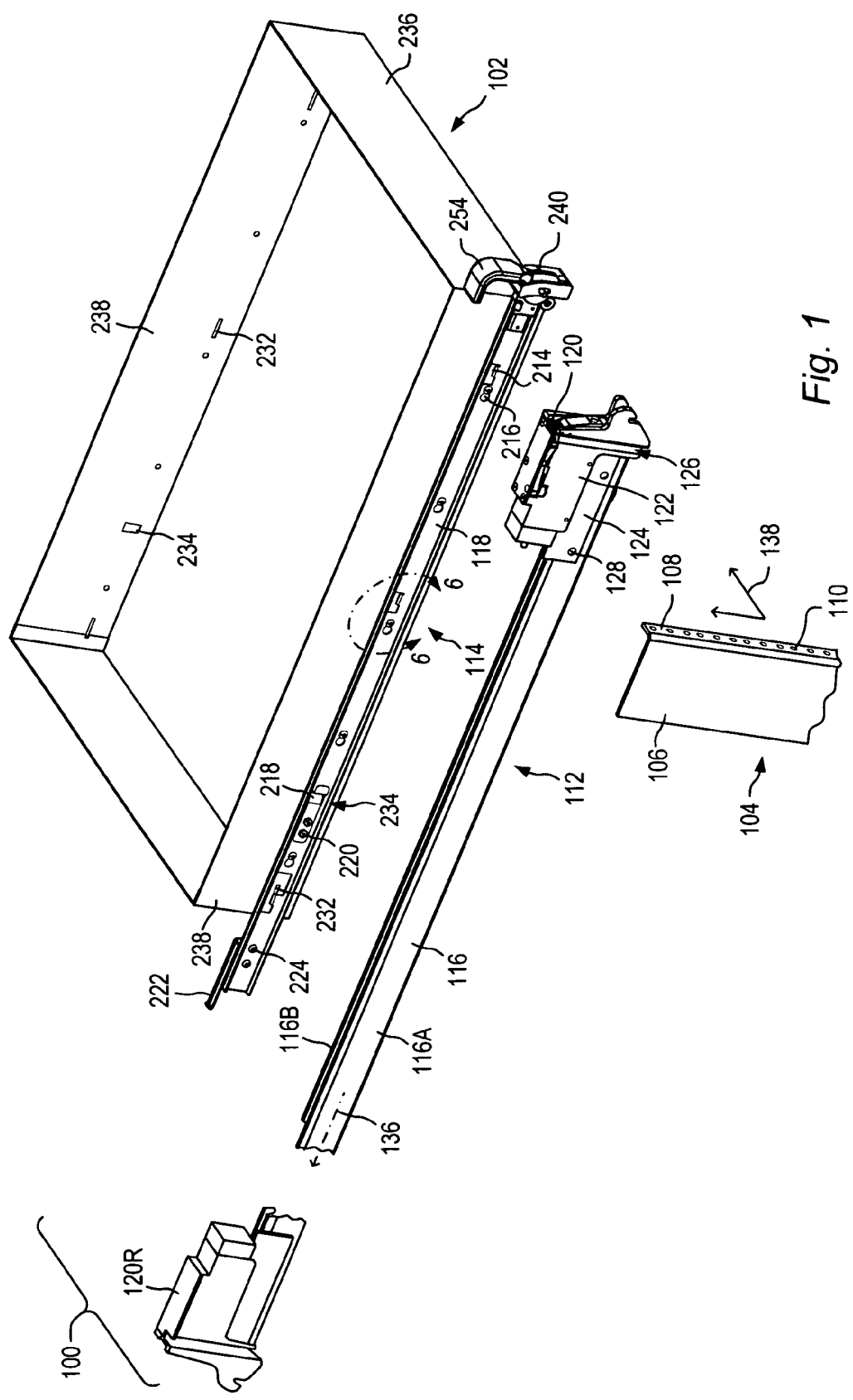
FIG. 1 depicts a system for mounting a component in a rack.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

A system for mounting a component in a rack may include slide assemblies. Each slide assembly may include an outer slide member to be attached to the rack and a complementary inner slide member to be attached to the component. In some embodiments, the slide members may allow for attachment to the component and the rack without the use of any tools. For example, an outer slide assembly may include a latch that engages a portion of a rack rail to secure an outer slide member to the rack rail. An inner slide member may include tabs. The tabs may engage slots in a chassis of a component to secure the inner slide member to the component.

In some embodiments, a slide assembly may include a latch. A latch on a slide assembly may advantageously eliminate a need for a tool to install the slide assembly in a rack. A latch on a slide assembly may also eliminate a need for separate fasteners (e.g., screws) to install the slide assembly. Eliminating separate fasteners may reduce the number of components required in a system. Eliminating separate fasteners may also reduce a risk of damage or loss caused by fasteners dropped in a computer system.

FIG. 1 depicts an embodiment of rackmount system 100 for mounting component 102 in a rack assembly. In some embodiments, the rack assembly may include left and right front rails and left and right rear rails. Rack rail 104 in FIG. 1 is shown as a left hand front rail. Rack rail 104 may include side panel 106 and vertical flange 108. Vertical flange 108 may include holes 110. Holes in a rack rail may be any of various forms, including, but not limited to, round, square, rectangular, or diamond-shaped. Holes may be through holes or blind holes. A rail on the other side of component 102 (e.g., the right side) may be a mirror image of rack rail 104. Rear rack rails may be of generally the same form as the front rack rails. It will be appreciated that other rackmount systems might be designed to mount in a rack having fewer rails (e.g., a rack having only front rails, or only rear rails).

Rackmount system 100 may include outer slide assembly 112 and inner slide assembly 114. Outer slide assembly 112 may couple with rack rail 104. Inner slide assembly 114 may couple with component 102. Outer slide member 116 of outer slide assembly 112 may slidably engage inner slide member 118. Slide assemblies on either side (e.g., left side and right side) of component 102 may support component 102 in the rack assembly.

In some embodiments, an outer slide assembly and inner slide assembly may be fully fixed with respect to the rack and component, respectively. In other embodiments, one or both of outer slide members 116 and/or inner slide member 118 may include one or more telescoping sections. For example, inner section 116B of outer slide members 116 (shown in FIG. 1) may be a telescoping section. Outer section 116A may be fixed with respect to the rack. Inner section 116B may slide with respect to outer section 116A. Inner section 116B may at least partially slide out of the rack during withdrawal of component 102.

In some embodiments, an outer slide assembly may include one or more latches. A latch may be used to couple an outer slide member to one or more rack rails. In certain embodiments, a latch for a slide assembly may be a slam latch. As used herein, "slam latch" includes any mechanism or device that automatically closes when the latch is positioned or oriented in contact with or proximate to another element. For example, a slam latch may close when a portion of the slam latch is placed against another element. As used herein, a latch is "closed," or in a "closed position," when the latch inhibits separation of two or more elements of a system. As used herein, a latch is "open," or in an "open position," when the latch does not inhibit separation of two or more elements of a system.

Figure 2:
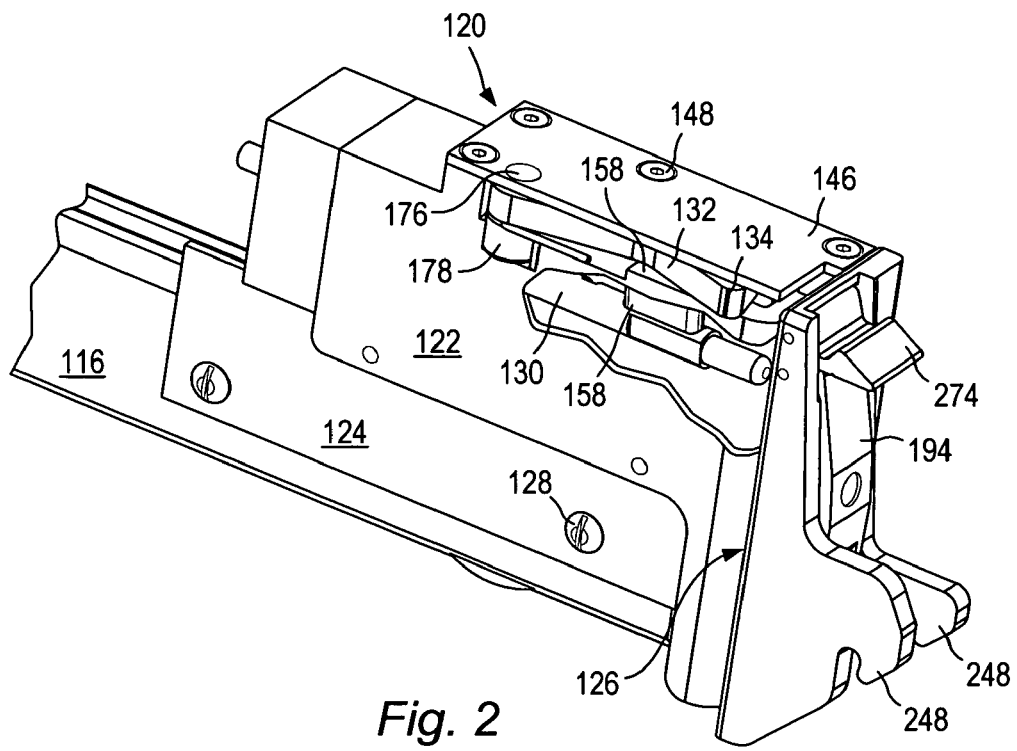
FIG. 2 depicts a slam latch viewed from an exterior side.

FIG. 2 depicts an external view of slam latch 120 viewed from an exterior side. Slam latch 120 may include body 122 and bracket 124. Body 122 may include channel 126. Slam latch 120 may be coupled to outer slide member 116 at bracket 124 using fasteners 128. Fasteners 128 may be of various types, including, but not limited to, screws, rivets, or bolts.

A latch may include an engaging member to couple the latch to a portion of a rack structure. For example, as shown in FIG. 2, slam latch 120 may include support pin 130. Support pin 130 may be selectively retractable from and extendable into channel 126 of body 122. Support pin 130 may engage one of holes 110 on rack rail 104 (shown in FIG. 1) when vertical flange 108 is in channel 126. Support pin 130 may be resiliently biased to engage rack rail 104. Engagement of support pin 130 may couple slam latch 120 to rack rail 104.

In certain embodiments, a latch may include a cocking element. As used herein, "cocking element" includes any element that cocks or holds an engaging member of a latch in an open position. A cocking element may be a separate element or a portion of another element (such as a portion of a support pin or a portion of a latch body). In one embodiment, cocking element may be armature 132 shown in FIG. 2. Armature 132 may be pivotally coupled to body 122. Armature 132 may include protrusion 134. When slam latch 120 is placed against side panel 106 of rack rail 104, contact between side panel 106 of rack rail 104 and protrusion 134 may cause armature 132 to deflect relative to body 122, thereby rotating armature 132. Rotation of armature 132 may sequentially cock support pin 130 into an open position and release support pin 130 to a closed position. Support pin 130 may engage one of holes 110 in rack rail 104 to couple latch 120 to rack rail 104.

In some embodiments, a latch (e.g., slam latch 120) may include an alignment portion that engages a portion of a rack structure. The alignment portion may establish orientation and/or alignment of a slide member or other element of a rackmount system relative to the rack structure. For example, an alignment portion may establish a perpendicular relationship between a rack rail and a slide member. Alignment portions may include, but are not limited to, slots, rails, pins, ridges, and grooves. In one embodiment, an alignment portion may be channel 126 shown in FIG. 2. Channel 126 may receive a section of vertical flange 108 of rack rail 104. Channel 126 may orient outer slide member 116 such that longitudinal axis 136 (shown in FIG. 1) of outer slide member 116 is perpendicular to plane 138 (shown in FIG. 1) passing though vertical flange 108 when outer slide assembly 112 is coupled to rack rail 104.

One or more alignment portions in a rackmount system may promote mutual alignment between slide members or other elements of a rackmount system. In some embodiments, alignment portions may be provided in left and right front locations and left and right rear locations of a rackmount system. Alignment of slide members may eliminate a need to leave one or more slide members loosely installed in a rack when a component is initially installed in the rack to accommodate misalignment of the slide members. Not having loose slide members may make installation of a component safer.

Figure 3:
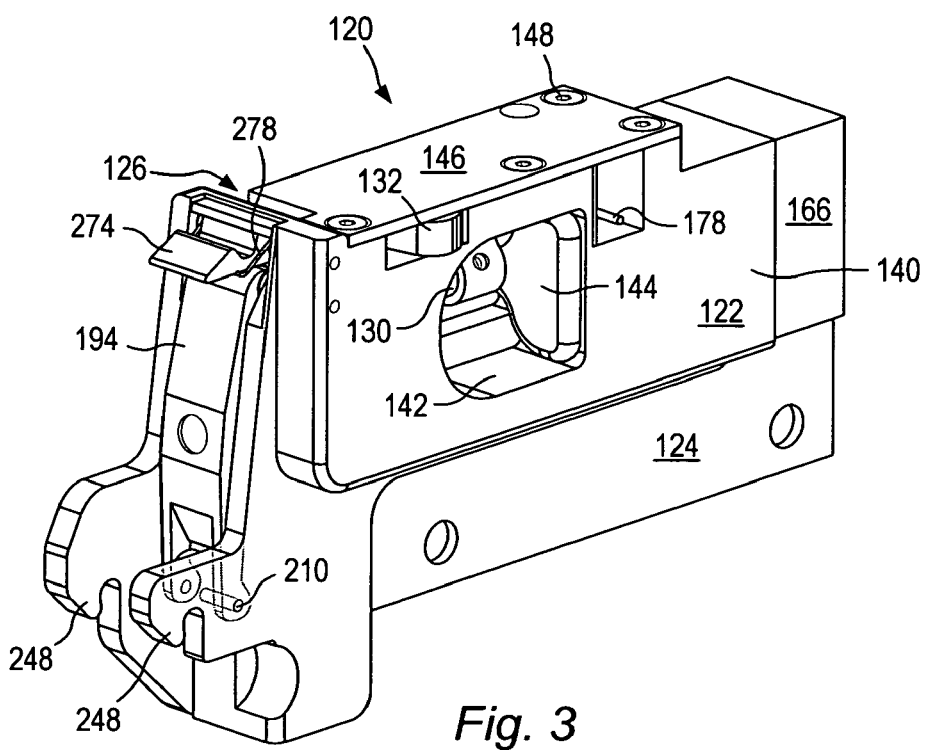
FIG. 3 depicts a slam latch viewed from an interior side.

FIG. 3 depicts an external view of slam latch 120 viewed from an interior side. Interior side 140 of body 122 may include cavity 142. Button 144 may be provided in cavity 142. Button 144 may be attached to support pin 130 with an allen screw, pin, rivet, or other fastener. Button 144 may allow a user to manually retract support pin 130 from channel 126. Cover plate 146 may retain armature 132 in body 122. Cover plate 146 may be attached to body 122 using screws 148 or other standard fasteners.

Since button 144 is located on interior side 140 of slam latch 120, button 144 may be obscured by component 102 when component 102 is in the rack. Thus, button 144 may be inaccessible to a user when component 102 is in the rack. Locating a release (e.g., button 144) such that it is inaccessible to a user when a component is installed may prevent a user from inadvertently releasing an outer slide assembly from a rack while the component is installed, thus enhancing safety of the rack system. In other embodiments, a release may be fully or partially accessible when a component is installed.

Figure 4:
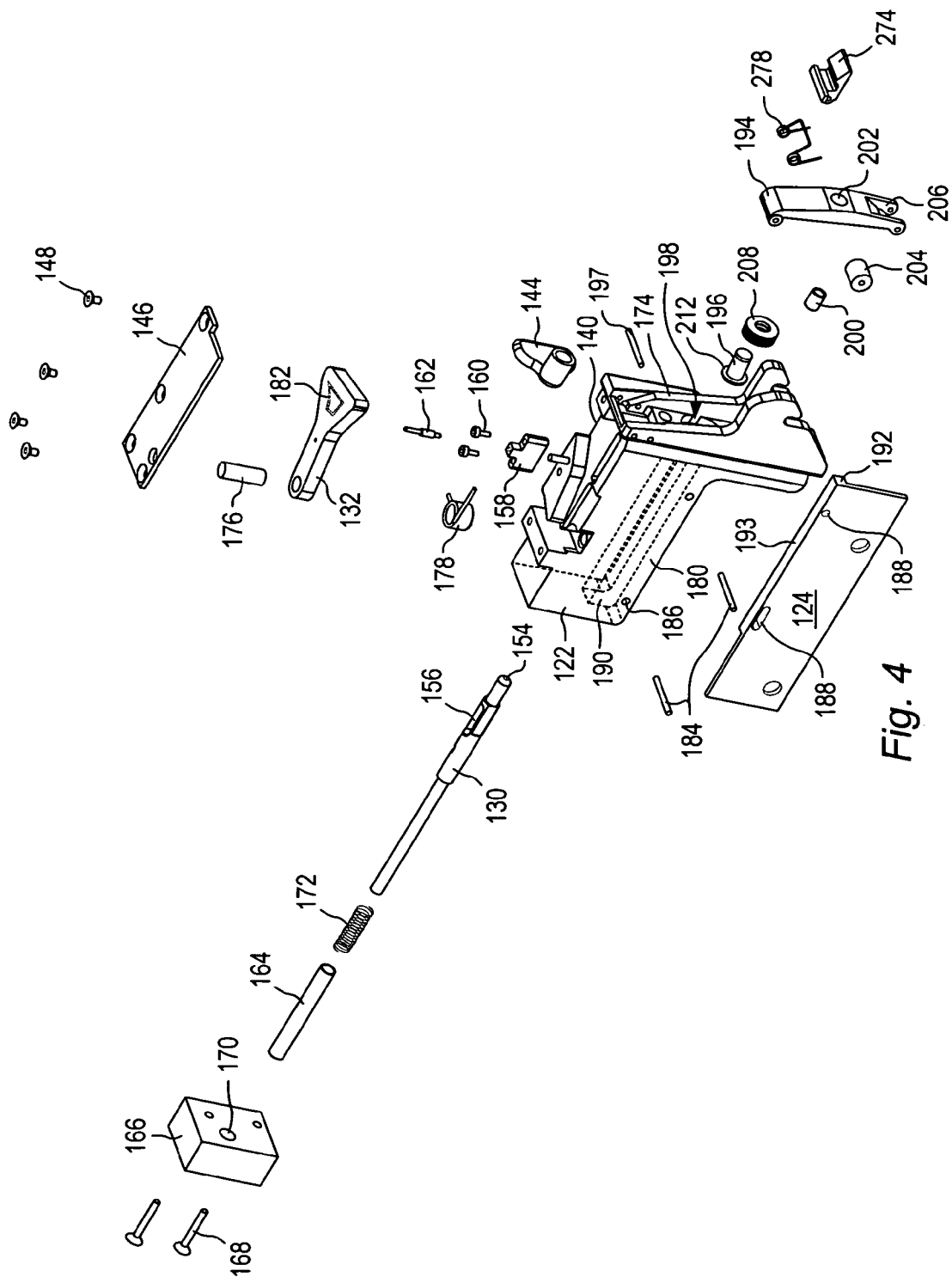
FIG. 4 depicts an exploded view of a slam latch.

FIG. 4 depicts an exploded view of slam latch 120. Support pin 130 may include tip 154 and recess 156. Tip 154 may be tapered, rounded, or otherwise shaped to facilitate engagement of support pin 130 in one of holes 110 (shown in FIG. 1). Recess 156 may receive rib 158. Rib 158 may be attached to support pin 130 using screws 160. Rib 158 may hold tracing pin 162. Support pin 130 may slide within sleeve 164. Back cap 166 may retain sleeve 164 in body 122. A portion of sleeve 164 may fit into hole 170 in back cap 166. Back cap 166 may be attached to body 122 with fasteners 168. Spring 172 may urge support pin 130 toward front end 174 of slam latch 120.

Armature 132 may be pivotally coupled to body 122 using pivot pin 176. Torsion spring 178 may bias armature 132 toward exterior side 180 of body 122 and away from interior side 140. Armature 132 may include groove 182 on an underside of armature 132. Tracing pin 162 may engage groove 182. Rotation of armature 132 on pivot pin 176 may affect a position of support pin 130 (e.g., release or retract the support pin) as tracing pin 162 traces groove 182.

Bracket 124 may couple with body 122 at slot 190. Dowel pins 184 may be press-fitted into holes 186 of body 122. Dowel pins 184 may pass through holes 188 in bracket 124 to retain body 122 on bracket 124. One or more of holes 188 in bracket 124 may be elongated to allow for some tolerance in spacing and/or alignment of dowel pins 184. Bracket 124 may include lip 192. Lip 192 may define a width of top face 193 of bracket 124. A width of top face 193 of bracket 124 may be less than a width of slot 190. Clearance between bracket 124 and the sides of slot 190 may allow some lateral adjustment of body 122 with respect to bracket 124 (and with respect to outer slide member 116 shown in FIG. 1). Lateral adjustment of body 122 may account for physical tolerances in the system (e.g., spacing tolerances between left and right rails of a rack). In some embodiments, the dimensions of lip 192 may be selected to achieve a desired amount of float of body 122 relative to bracket 124.

Figure 5A:
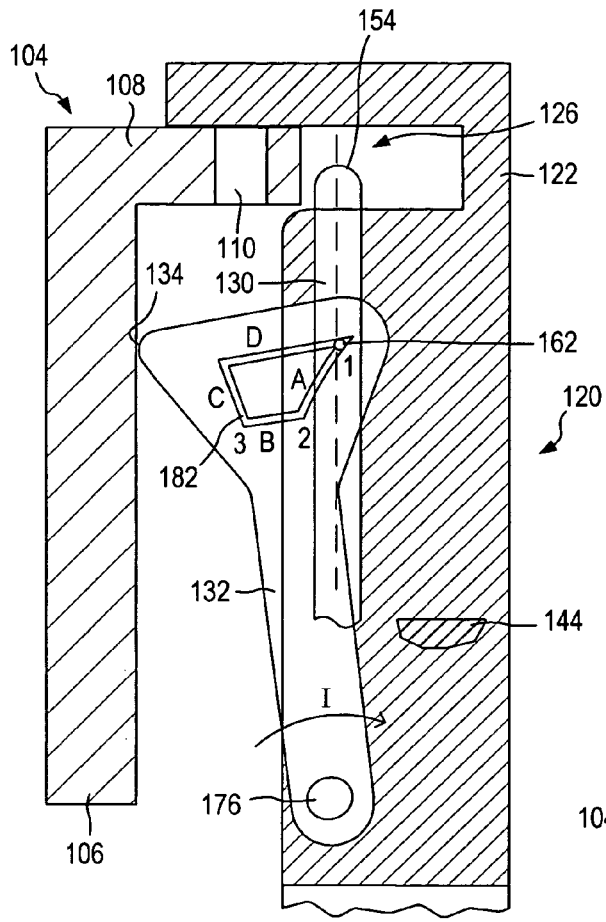
FIGS. 5A-5D depict schematic bottom views of a slam latch during installation on a rack rail.

FIGS. 5A-5D depict schematic bottom views of slam latch 120 as slam latch 120 is installed on rack rail 104. Initially, support pin 130 may be in a closed position (FIG. 5A). Tip 154 of support pin 130 may be in channel 126. Tracing pin 162 may be in position 1 of groove 182. A user may place slam latch 120 in the proximity of rack rail 104. Protrusion 134 may contact side panel 106 of rack rail 104. Vertical flange 108 may enter channel 126.

The user may push slam latch 120 toward side panel 106. As slam latch 120 is moved toward side panel 106, contact of protrusion 134 with side panel 106 may cause armature 132 to rotate about pivot pin 176 in the direction of the arrow I. Tracing pin 162 may trace section A of groove 182. As tracing pin 162 traces section A of groove 182, engagement of tracing pin 162 with groove 182 may cause support pin 130 to be drawn back against the force of spring 172 (shown in FIG. 4) such that tip 154 of support pin 130 is retracted from channel 126. Tracing pin 162 may reach point 2 of groove 182 and advance into section B of groove 182 (FIG.

5B). Engagement of tracing pin 162 and groove 182 in section B of groove 182 may inhibit support pin 130 from advancing toward vertical flange 108. Thus, support pin 130 may be cocked as slam latch 120 is initially installed on rack rail 104. In another embodiment, support pin 130 may be cocked manually by a user (e.g., using button 144) before slam latch 120 is placed in proximity with rack rail 104.

Figure 5B:
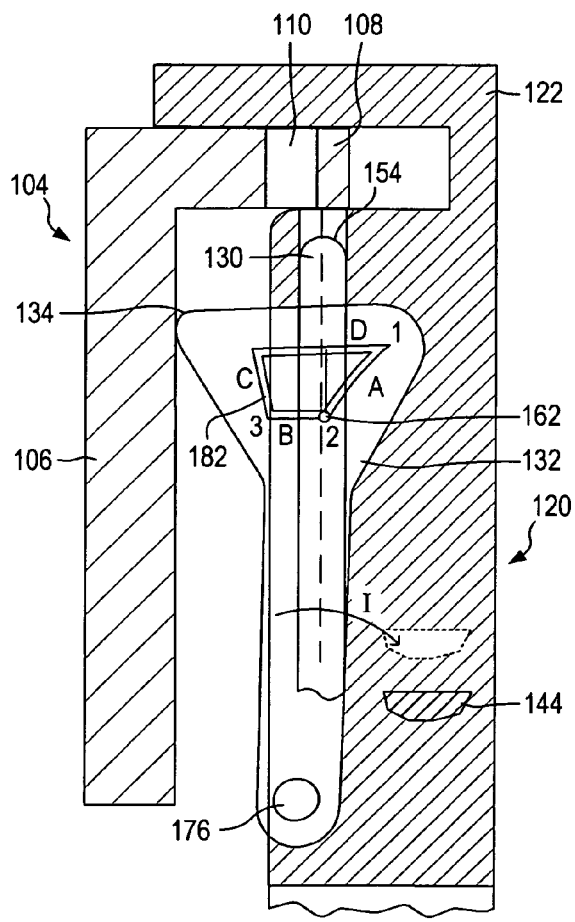
Figure 5C:
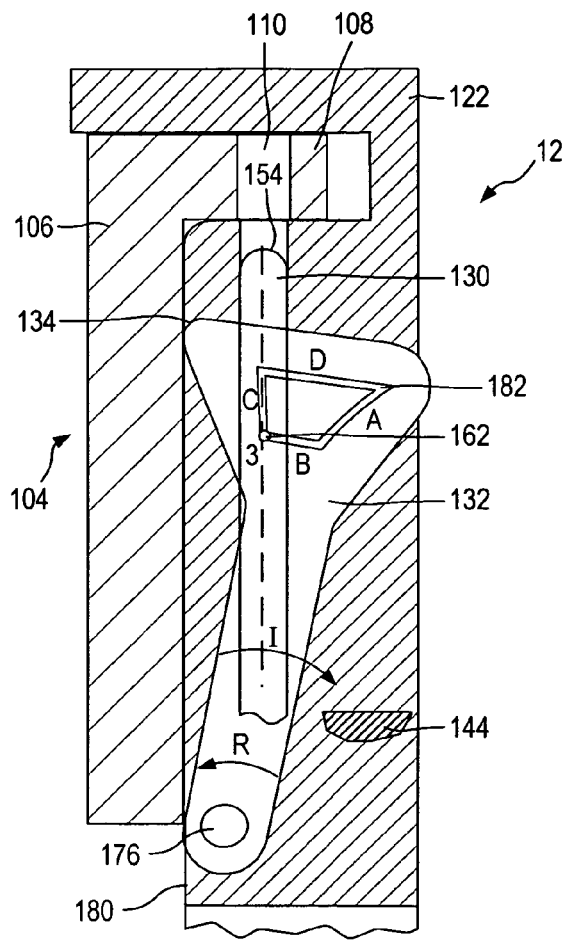
Figure 5D:
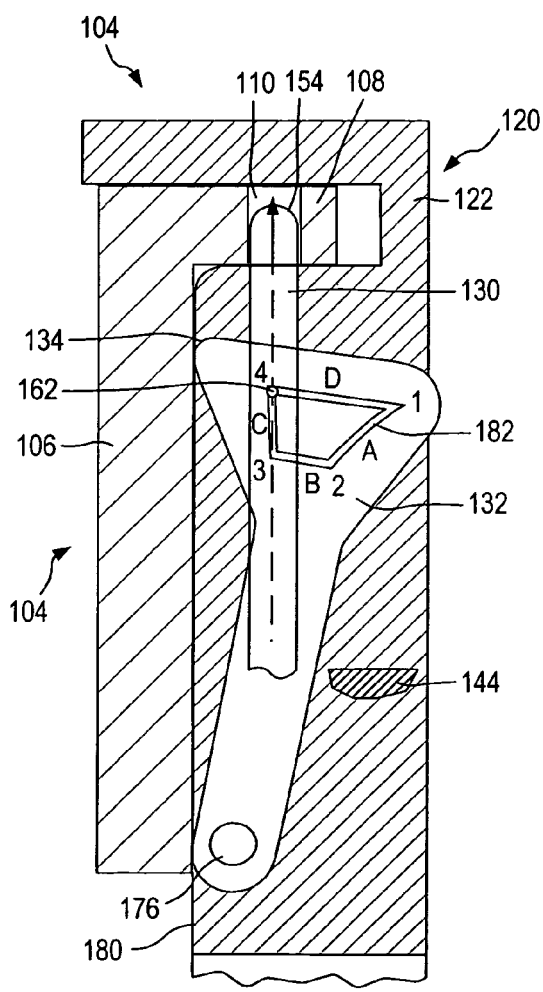

The user may continue to push slam latch 120 against side panel 106 until exterior side 180 of body 122 contacts side panel 106 (FIG. 5C). Armature 132 may rotate in the direction of arrow I until tracing pin 162 reaches point 3 of groove 182. When tracing pin 162 reaches point 3 of groove 182, support pin 130 may be released into hole 110 under the force of spring 172. Tracing pin 162 may advance in section C of groove 182 until tracing pin 162 reaches point 4 (See FIG. 5D). In some embodiments, hole 110 may not be vertically aligned with tip 154 when support pin 130 is released from a cocked position. The user may adjust (e.g., wiggle) slam latch 120 on rack rail 104 if needed until tip 154 is aligned with hole 110. Rounded surfaces on tip 154 may promote engagement of tip 154 with hole 110.

To remove slam latch 120 from rack rail 104, the user may push button 144 to displace support pin 130 in a rearward direction such that tip 154 is retracted from hole 110. The user may separate slam latch 120 from side panel 106. When tracing pin 162 reaches point 3 of (see FIG. 5C), armature 132 may rotate in direction R under the force of torsion spring 178. In some embodiments, engagement of tracing pin 162 in section B of groove 182 may maintain support pin 130 in a cocked position (e.g., as shown in FIG. 5B) during removal of slam latch 120. In other embodiments, armature 132 may continue to rotate under the force of torsion spring 178 until tracing pin 162 reaches point 1 (FIG. 5A). In certain embodiments, section D of groove may be used to allow repositioning of armature 132 when slam latch 120 is not installed on a rack rail.

In some embodiments, a rackmount system (e.g., rackmount system 100) may include a locking mechanism that locks a component in a rack. A locking mechanism may lock a component in various ways including, but not limited to, clamping, wedging, cam action, frictional engagement, or an interference fit. A locking mechanism on a slide assembly may help establish a firm connection between a component and a rack. A firm connection between a component and a rack may reduce displacement or deflection of elements (e.g., electronic devices, disk drives) on or in the component when the rack is exposed to vibration and/or shock environments, thereby increasing the reliability of the component. A firm connection between a component and a rack may reduce a susceptibility of the component to failure under severe environmental conditions (e.g., earthquakes).

In some embodiments, a slam latch may include elements of a locking mechanism. Referring again to FIG. 4, slam latch 120 may include roller arm 194 and compression pin 196. Roller arm 194 may be pivotally coupled with body 122 on hinge pin 197, and may include hole 202. Roller arm 194 may also include cylindrical pocket 199 (See FIG. 11) on its underside surface. The shaft of compression pin 196 may reside in hole 202 in a sliding relationship with roller arm 194, and head portion 212 of compression pin 196 may reside in opening 198 of body 122. Opening 198 may extend through body 122 to channel 126. Spring 200 may be captured in pocket 199 (See FIG. 11). Roller 204 may be rotatably coupled to roller arm 194 at clevis 206.

Spring 208 may be placed on compression pin 196. In one embodiment, spring 208 may be a stack of conical washers (e.g., Belleville washers). Spring 208 may also be various other types of springs, such as a coil spring or flat spring. Opposing ends of spring 208 may engage head portion 212 of compression pin 196 and underside of roller arm 194, respectively. The compliant behavior of spring 208 may allow roller arm 194 to transmit a relatively constant force to compression pin 196 when head portion 212 of compression pin 196 is moved closer to or farther away from roller arm 194.

Spring 200 may urge roller arm 194 to rotate away from body 122 about hinge pin 197. Compression pin 196 may be retained in roller arm 194 (e.g., using pin-in-slot) such that compression pin 196 moves away from body 122 in concert with roller arm 194. Stop pin 210 (shown in FIG. 3) may limit rotation of roller arm 194.

To lock outer slide assembly 112 on rack rail 104, a force may be applied to roller 204 (e.g., by locking lever 254 of inner latch assembly 240 shown in FIG. 1). Roller arm 194 may compress spring 208, causing spring 208 to drive compression pin 196 against rack rail 104 (shown in FIG. 5C) such that rack rail 104 is clamped between head portion 212 of compression pin 196 and a rear wall of channel 126. A compression pin may have various forms. Examples of cross-sectional shapes for a compression pin include, but are not limited to, circular, square, rectangular, and hexagonal. A compression pin may be a separate element or part of another element.

Rack rails of varying thicknesses may be encountered in using the invention, depending on the manufacturer and model of the rack being used. In order to reliably obtain secure clamping behavior for a variety of rack rail thicknesses, head portion 212 of the compression pin 196 may need to move to a plurality of distances from the rear wall of channel 126 when locking lever 254 is moved to its locked position. The compliant behavior of spring 208 may allow the locking lever to apply a relatively constant and effective clamping force to compression pin 196 when head portion 212 of compression pin 196 to moves to a plurality of positions depending on the thickness of rack rail 104.

Referring again to FIG. 1, inner slide assembly 114 may include inner slide member 118. Inner slide member 118 may include tabs 214 and apertures 216. Leaf spring 218 may be attached to inner slide member 118 using fasteners 220. In some embodiments, inner slide member 118 may extend beyond the end of component 102. Shelf member 222 may be coupled to inner slide member 118 using fasteners 224. It will be understood that in some embodiments a shelf member may be integral to a slide member, rather than a separate component. Shelf member 222 may have suitable cross section to engage a portion of an outer slide assembly. In an embodiment, the shelf member may engage a portion of an outer slide member as the component is initially positioned for installation in the rack. In some embodiments, a shelf member may engage an outer slide member. In other embodiments, a shelf member on an inner slide member may engage a complementary shelf member (e.g., a protruding rim or tab) on an outer slide member, the rack rail, or other rack structure.

Figure 6:
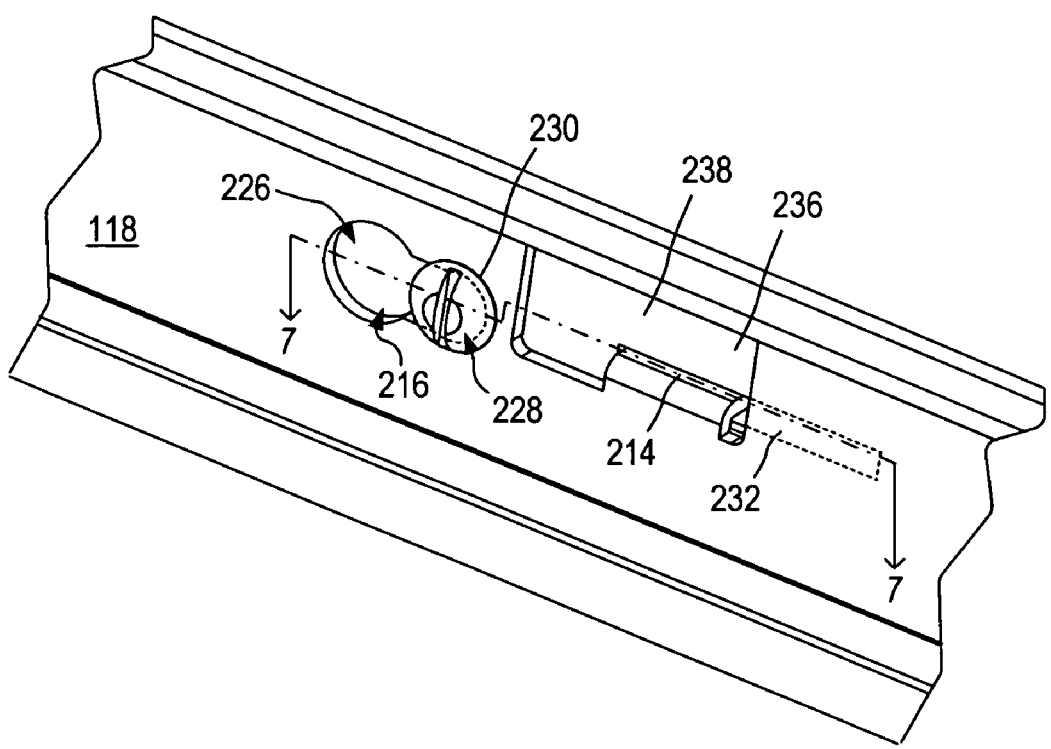
FIG. 6 depicts a detail view of an inner slide member on a component taken substantially in zone 6-6 of FIG. 1.
Figure 7:
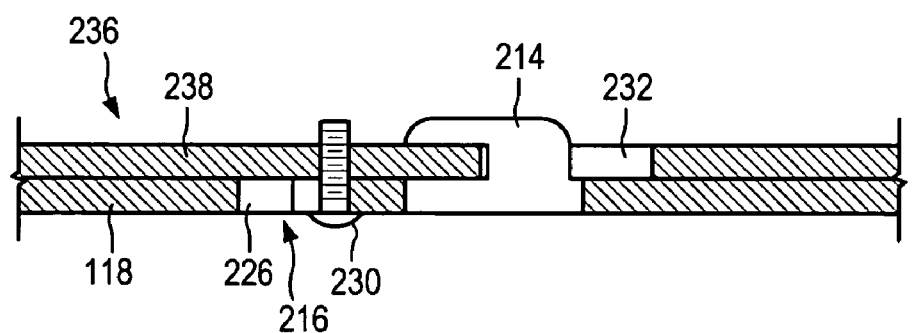
FIG. 7 depicts a cross sectional view of an inner slide member on a component taken substantially along lines 7-7 of FIG. 6.

In some embodiments, an inner slide member may be coupled to a component without using tools. FIGS. 6 and 7 depict a detail view of tabs 214 and apertures 216 as installed on a component chassis. Apertures 216 may include large portion 226 and small portion 228. Large portion 226 of apertures 216 may allow a head of hanger 230 (e.g., a screw as depicted in FIGS. 6 and 7) to pass through. To install inner slide member 118 on component 102, inner slide member 118 may be placed against chassis 236 such that the heads of hangers 230 on chassis 236 pass through large portions 226 of apertures 216 and tabs 214 pass through slots 232 in chassis 236. Inner slide member 118 may be shifted along its longitudinal axis such that hangers 230 align with small portion 228 of apertures 216 (as shown in FIGS. 6 and 7). Tabs 214 may engage side walls 238 of chassis 236 of component 102. Engagement of heads of hangers 230 in small portions 228 of aperture 216 and engagement of tabs 214 with side walls 238 near slots 232 may inhibit separation of inner slide member 118 from component 102. Engagement of leaf spring 218 (shown in FIG. 1) in opening 234 of chassis 236 may inhibit inner slide member 118 from sliding axially relative to component 102.

In some embodiments, an inner slide assembly (e.g., inner slide assembly 114) may include a latch to inhibit sliding of an inner slide member relative to an outer slide member. For example, as shown in FIG. 1, inner slide assembly 114 may include inner latch device 240. In other embodiments, an outer slide assembly may include a latch that engages a catch on a component or inner slide member.

Figure 8:
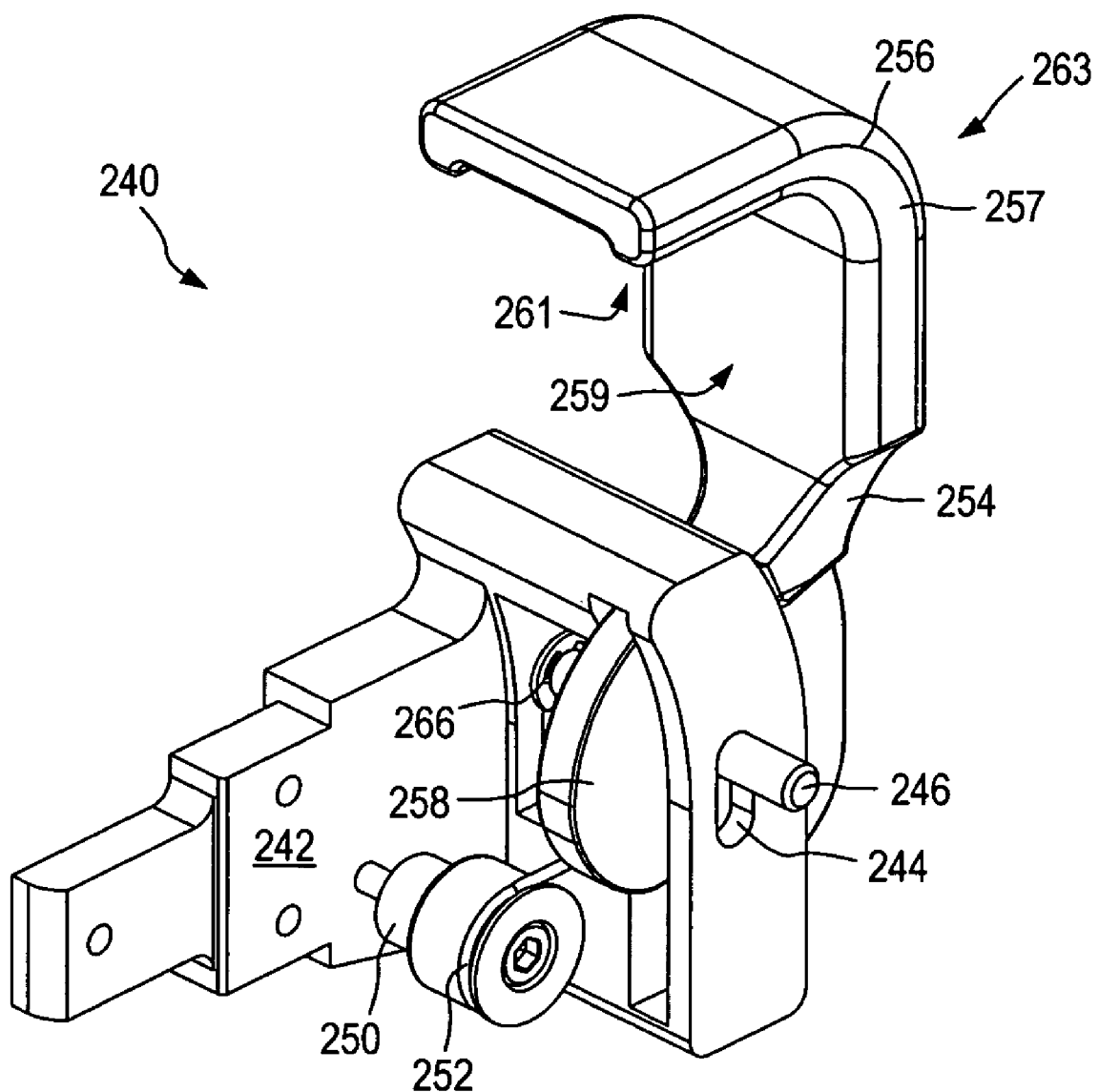
FIG. 8 depicts an inner latch assembly including a locking lever.

FIG. 8 depicts an external view of inner latch device 240. Inner latch device 240 may include bracket 242. Bracket 242 may include slots 244. Slots 244 may accept cross pin 246. Post 250 may be coupled to bracket 242. Spring 252 may be installed on post 250. Spring 252 may resiliently bias cross pin 246 upwardly in slots 244.

In some embodiments, an inner latch device may include a locking member for a lock mechanism. Such a locking member may be, but is not limited to, a lever, a wedge, a cam, a screw, a pin, or a combination thereof. For example, as shown in FIG. 8, a locking member may be locking lever 254. Locking lever 254 may be pivotally coupled to cross pin 246 of inner latch device 240.

Figure 9:
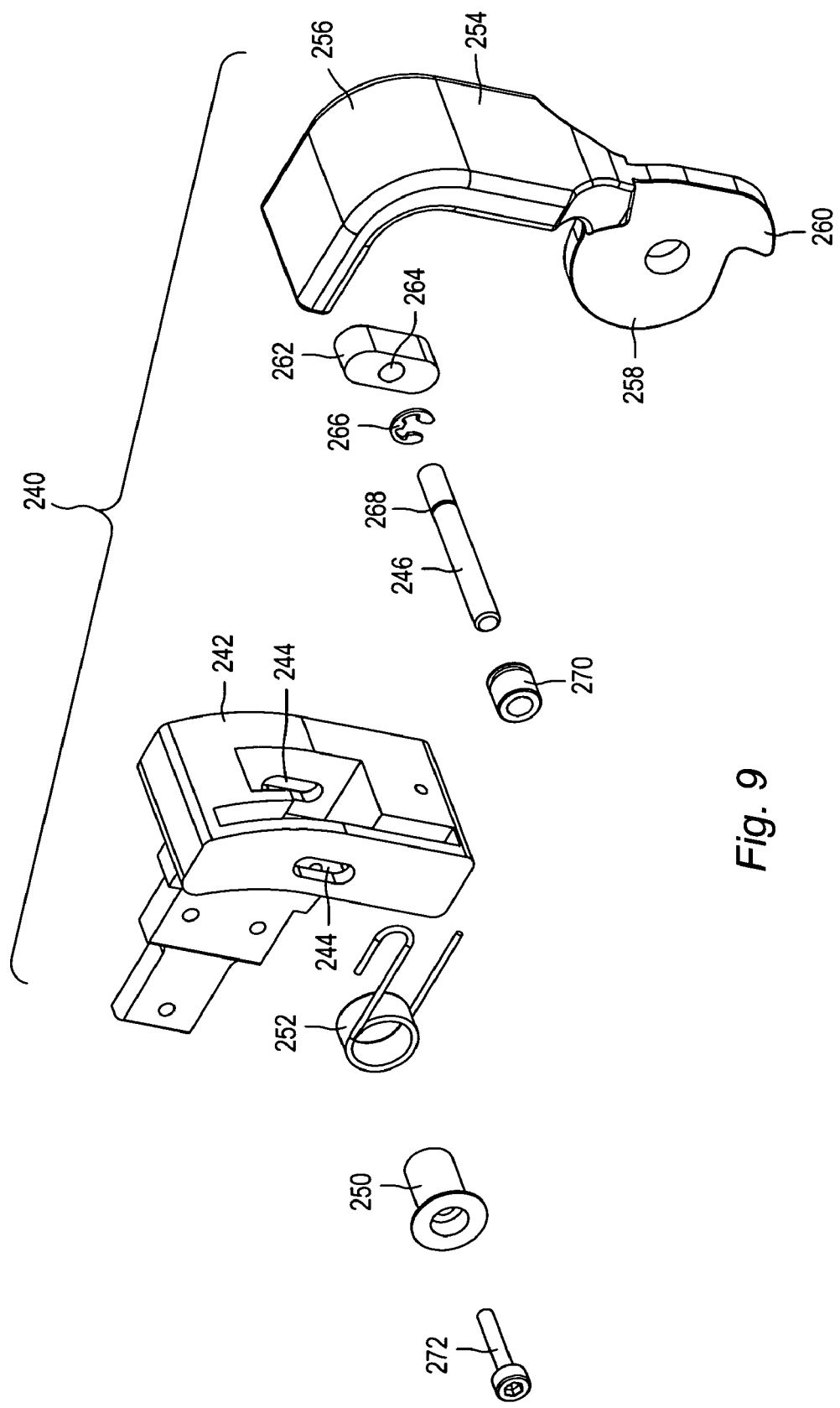
FIG. 9 depicts an exploded view of an inner latch device including a locking lever.

FIG. 9 depicts an exploded view of inner latch device 240 including locking lever 254. Locking lever 254 may include handle portion 256, cam portion 258, and prong 260. A handle portion on a locking lever may eliminate a need for a tool (e.g., wrench, screwdriver) to operate a locking mechanism. Handle portion 256 may be used to position component 102 (e.g., move the component into a serviceable position).

Cross pin 246 of inner latch device 240 may slidably engage slots 244. Slide cap 262 may include hole 264. Hole 264 may fixably engage one end of cross pin 246. Retaining ring 266 may engage groove 268 on cross pin 246. Retaining ring 266 may inhibit cross pin 246 from moving laterally relative to bracket 242. Slide cap 262 may prevent cross pin 246 from rotating around its longitudinal axis. Locking lever 254 may be rotatably coupled on cross pin 246 by way of bushing 270. Post 250 may be attached to bracket 242 using screw 272.

As shown in FIG. 1, locking lever 254 may open (e.g., rotate) downwardly with respect to the rack. A locking lever that opens downwardly may provide an intuitive feel to a user. It will be understood, however, that locking lever could open in other directions (e.g., upwardly, left to right).

Referring again to FIG. 8, handle portion 256 of locking lever 254 may include angled section 257. As shown in FIG. 8, angled section 257 may be an "L"-shape. It will be understood that handle portion 256 of locking lever 254 may have any of various other shapes, such as a T-shape, a U-shape, a bar, a hook, or a ring. Handle portion 256 may include rounded (e.g., radiused) edges and/or adequate surface area (e.g., via a widened section) to allow a user to comfortably apply a load to the handle portion to lock or release locking lever 254, or to use the handle portion to push or pull a component into or out of the rack.

In some embodiments, handle portion 256 may allow a user to insert at least two fingers behind the handle portion and grasp the handle portion when the locking lever is in a locked position (e.g., to pull the component out of the rack). Pulling surface 259 may be engaged by fingers of the user to pull to release locking lever 254. Upon release of locking lever 254 may rotate downwardly (e.g., about 90 degrees). Pulling surface 261 (see also FIG. 11) may be engaged by one or more fingers of a user to pull a component out of a rack. Conversely, to place locking lever 254 in a locked position, pushing surface 263 of handle portion 256 may be engaged by a palm of a user's hand to rotate locking lever 254 upwardly.

Figure 10:
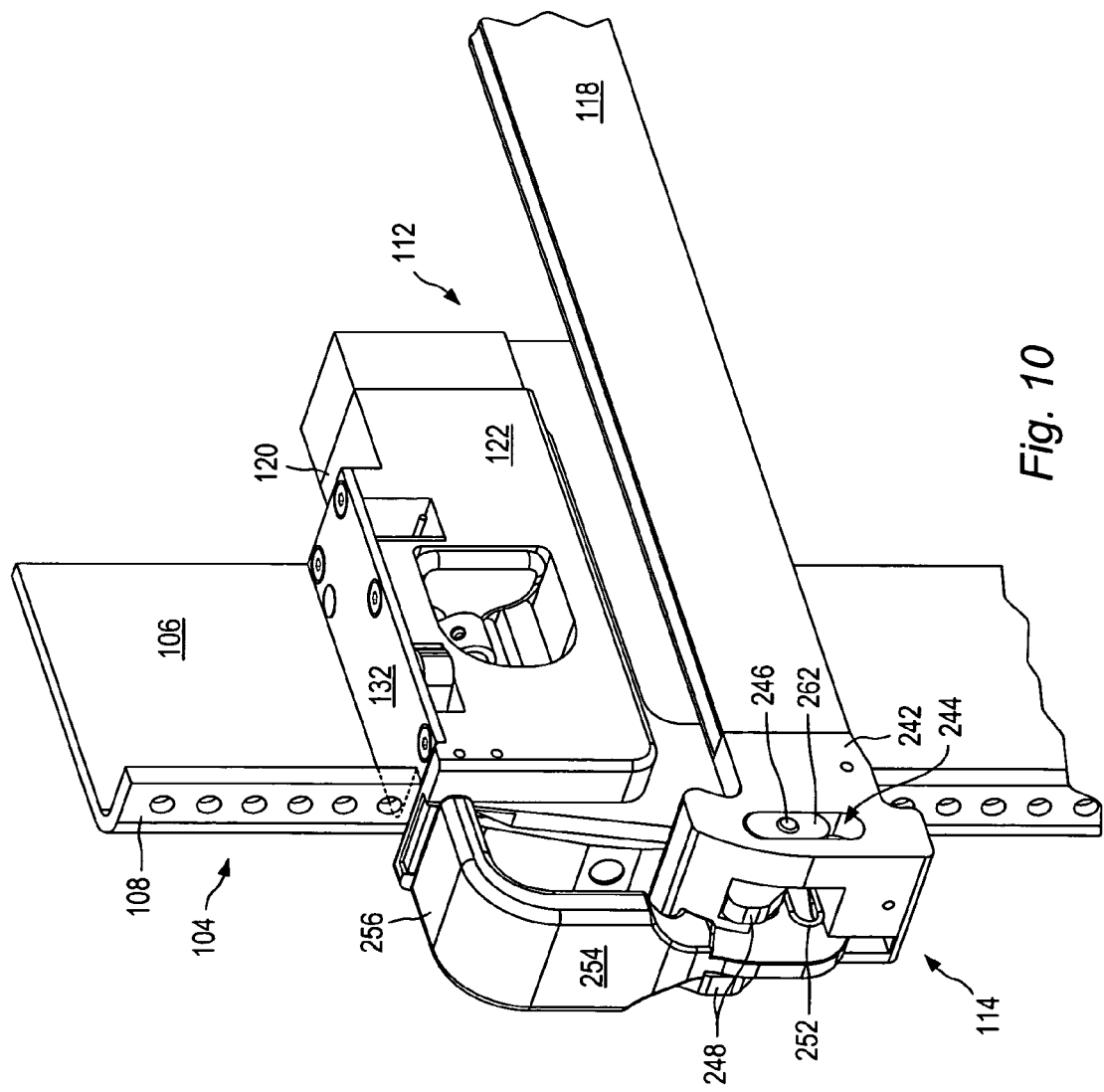
FIG. 10 depicts an inner slide assembly having a locking lever coupled to an outer slide assembly having a slam latch.
Figure 11:
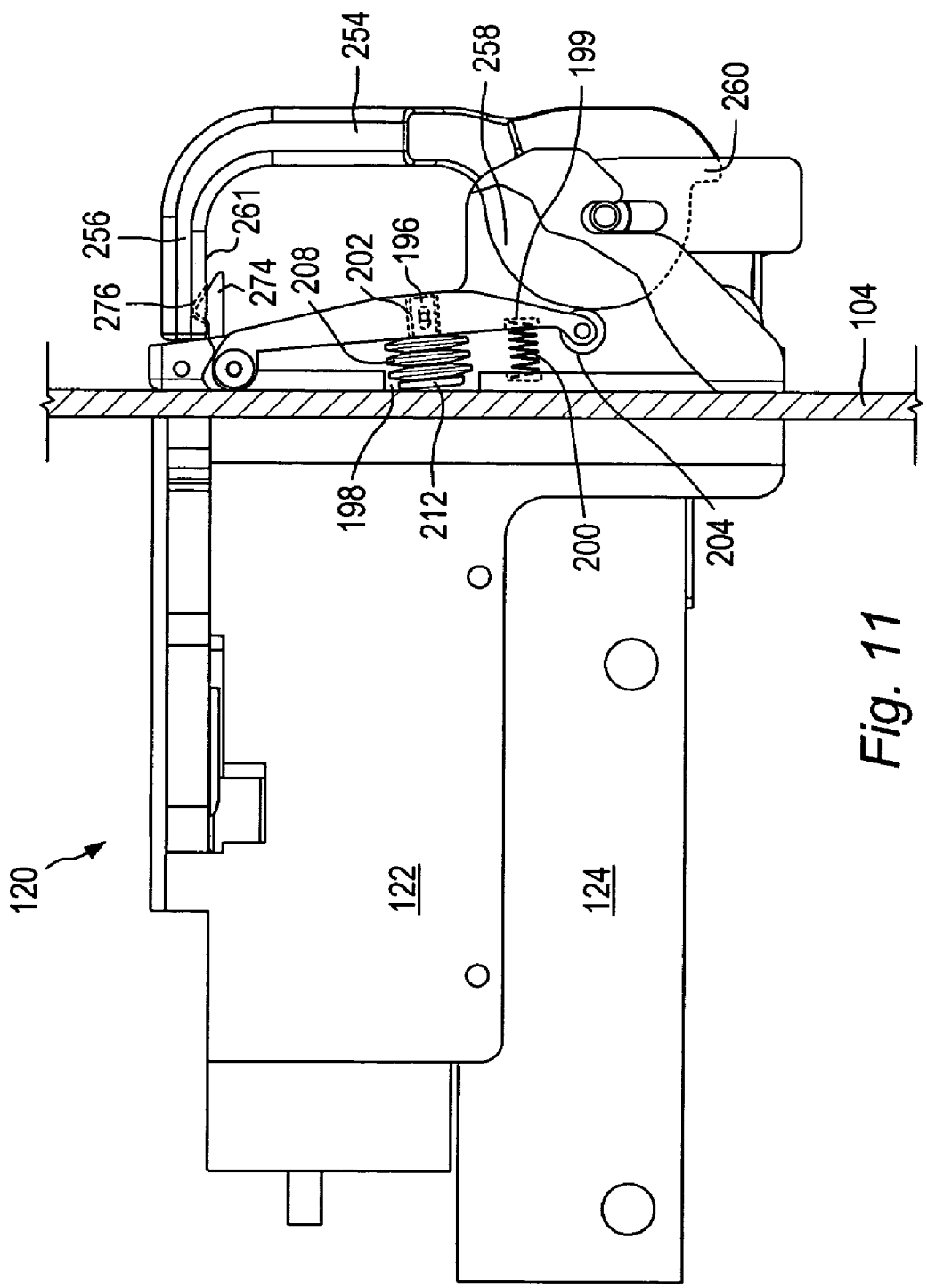
FIG. 11 depicts a partial cutaway side view of an inner latch coupled to a slam latch.

FIG. 10 depicts inner slide assembly 114 coupled to outer slide assembly 112 in a rack assembly (component 102 is not shown for clarity). FIG. 11 depicts a cutaway view of a portion of slam latch 120 and inner latch device 240. When inner slide assembly 114 is advanced on outer slide assembly 112, cross pin 246 of inner latch device 240 may engage hooks 248 on slam latch 120. Cross pin 246 may snap into hooks 248 under the force of spring 252. Engagement of cross pin 246 with hooks 248 may inhibit inner slide member 118 from sliding on outer slide member 116, thereby inhibiting component 102 from coming out of the rack assembly.

As shown in FIG. 10, locking lever 254 may be integrated into inner slide assembly 114 (e.g., preassembled with inner slide member 118 as part of inner latch device 240). In other embodiments, a locking member may be integrated into other elements of the rackmount system, such as an outer slide assembly. Integrating a locking member with another element of a rackmount system may eliminate a need for including a locking element on a rack or component and/or a need for a separate locking element (e.g., loose screws). It will be understood, however, that in certain embodiments a locking lever could be a separate element of a system, or be preassembled on a rack rail or the chassis of a component.

A user may grasp handle portion 256 of locking lever 254 and rotate locking lever 254 upwardly. As locking lever 254 is rotated upwardly, cam portion 258 of locking lever 254 (shown in FIG. 11) may displace roller 204. Roller arm 194 may pivot into body 122 against the force of spring 208. Spring 208 may force compression pin 196 to bear against rack rail 104. Compression pin 196 may be placed in compression between spring 208 and rack rail 104. The user may continue to rotate locking lever 254 until catch 274 on slam latch 120 engages pocket 276 on locking lever 254. Support spring 278 may resiliently support catch 274. Engagement of catch 274 in pocket 276 may hold locking lever 254 in a closed position.

To remove component 102, a user may exert an outward force on handle portion 256 of locking lever 254. When a force is applied to handle portion 256, support spring 278 may deflect such that locking lever 254 is released from catch 274. As the user continues to rotate locking lever 254, cam portion 258 may move along roller 204 in the reverse direction of when the lever was locked. Spring 200 may urge roller arm 194 away from body 122 of slam latch 120. Compression pin 196 may be pulled away from locking engagement against rack rail 104. During initial rotation of locking lever 254, cross pin 246 may remain engaged in hooks 248. Prong 260 of locking lever 254 may contact roller 204.

To release inner latch device 240, the user may depress handle portion 256 of locking lever 254. Cross pin 246 may be forced downwardly against the force of spring 252 until cross pin 246 disengages from hooks 248. Once cross pin 246 has cleared hooks 248, the user may withdraw component 102 from the rack assembly by pulling handle portion 256 of locking lever 254 away from the rack.

In some embodiments, a rackmount system for a component may include left and right outer slide assemblies. Each of the outer slide assemblies may include front and rear slam latches (e.g., latch 120 and rear latch 120R shown in FIG. 1) for engaging front and rear rack rails, respectively, of a rack assembly. The rackmount system may further include left and right inner slide assemblies each having front inner latch devices. Inner slide members may engage outer slide members to support a component in the rack. The left and right front inner latch devices may engage the left and right front slam latches, respectively, to inhibit the component from sliding out of the rack assembly. In certain embodiments, the inner latch devices may include locking members for locking the component in the rack assembly.

In an embodiment, a user may install a rackmount system and a component in a rack without the use of tools. An outer slide assembly including front and rear latches may be placed against front and rear rack rails on the left side of the rack. In one embodiment, aligning portions on the latches may used to align the outer slide assembly with respect to the rack rails. In certain embodiments, a length adjustment may be made to the outer slide assembly (e.g., by telescoping members of the outer slide assembly). The outer slide assembly may be secured to the rack by engaging the front and rear latches on the rack rails. An outer slide assembly may be secured to front and rear rack rails on the right side of the rack in a similar manner. A user may insert the outer slide assemblies through the front of the rack. In certain embodiments, the user may couple front and rear latches on each of the front and rear rack rails without accessing the rack from the rear side.

Inner slide assemblies may be coupled to the left and right sides of a component. The user may position the component in front of the rack. Shelf members on the inner slide assemblies may be used to guide the inner slide assemblies into alignment with the leading ends of the outer slide assemblies. In certain embodiments, the front end of the component may be temporarily rested on outer slide assemblies using one or both of the shelf members. The component may be advanced into the rack until inner latch devices on the inner slide assemblies latch on the outer slide assemblies. Locking members may be actuated to lock the component in the rack. The locking members may enhance a connection between the slide assemblies and the rack rails, as compared to a connection provided by the latches alone.

As discussed above, latches that secure outer slide assemblies to a rack may provide for lateral float between an outer slide member and the rack. In some embodiments, the outer slide members may automatically adjust (e.g., shift from left to right) when the component is initially installed. In other embodiments, a user may manually perform a lateral adjustment. Lateral adjustment of the outer slide members may mitigate the effects of left-to-right variations in rack rail spacing.

A component may be partially withdrawn from a rack to a serviceable position on a pair of slide assemblies. In some embodiments, telescoping sections (e.g., inner sections 116B shown in FIG. 1) may at least partially slide out of a rack when the component is withdrawn. The telescoping sections may support the component in the serviceable position. After servicing, the component may be reinstalled in the rack or removed from the rack.

Removal of a component from the rack may make releases on an outer slide assembly (e.g., button 144 shown in FIG. 3) accessible to a user. If desired, the user may remove the outer slide assemblies by actuating the releases. In some embodiments, the user may actuate releases on both front and rear latches of an outer slide assembly simultaneously (e.g., using one hand for each latch), thereby allowing the outer slide assembly to be quickly removed with a single step.

In the context of this patent, the term "coupled" includes direct coupling or indirect coupling (e.g., with one or more intervening elements). For example, a latch and a slide may be coupled by directly attaching the latch to the slide or by attaching each of the latch and the slide to an intervening element (e.g., to a component). In the context of this patent, the term "member" may include a single member or multiple members. Portions of a member may be straight and/or curved, flexible and/or rigid, or a combination thereof.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "vertical," "horizontal" "upward", "downward," "under", "over," "left," or "right" are used in the claims, they are to be understood to relate to the Figures as illustrated. However, the device may be turned at an angle to the horizontal or inverted with the quoted terms referring to the altered orientation. It will be understood that steps of a method may be performed in an order other than the order recited in a claim, unless the claim specifically states otherwise.

What is claimed is:

1. A system for mounting a component in a rack comprising:
    a first slide member;
    a slam latch coupled to the first slide member, the slam latch comprising:
        a body;
        a pin movably coupled to the body, wherein the pin is configured to engage a rail of the rack to couple the first slide member to the rail; and
        a cocking element;
    and
    a second slide member configured to couple with the component, the second slide member configured to engage the first slide member when the second slide member is coupled to the component and the component is inserted into the rack;
        wherein the cocking element is configured to hold the pin in a retracted position when the cocking element is in a first position to inhibit the pin from engaging the rail, and wherein the cocking element is configured to automatically release the pin into an aperture of the rail when the slam latch is placed proximate to the rail; and
        wherein the cocking element comprises an armature pivotally coupled to the body of the slam latch, wherein a portion of the armature is configured to be deflected by the rail when the latch is placed on the rail, wherein the armature is configured to automatically release the pin into a hole in the rack rail when the armature is deflected by the rail by a predetermined amount.

2. The system of claim 1, wherein the latch comprises an aligning portion configured to couple with a portion of the rail, wherein the aligning portion comprises a channel in the body, wherein the channel is configured to orient the first slide member at a desired angle relative to the rail.

3. The system of claim 1, wherein the latch further comprises a bracket, wherein the bracket is coupled to the first slide member, wherein the body is coupled to the bracket such that the body is movable in a lateral direction relative to the bracket.

4. The system of claim 1, further comprising a shelf member coupled to the second slide member, wherein the shelf member is configured to guide the second slide member into alignment with the first slide member.

5. The system of claim 1, further comprising a shelf member coupled to the second slide member, wherein the shelf member is configured to engage the first slide member to partially support the second slide member.

6. The system of claim 1, wherein the second slide member comprises a tab, wherein the tab is configured to couple with a slot in a chassis of the component.

7. The system of claim 1, wherein the second slide member comprises an aperture, wherein the aperture is configured to couple with a hanger on the component.

8. The system of claim 1, wherein the second slide member is coupled to a spring, wherein the spring is configured to couple with an opening of the chassis of the component, wherein the spring is configured to inhibit movement of the second slide member relative to the component when the spring is in the opening.

9. The system of claim 1, further comprising a locking mechanism, wherein the locking mechanism is configured to lock the second slide member relative to the first slide member.

10. The system of claim 1, further comprising a locking member coupled to the second slide member, wherein the locking member is operable by a user to lock the second slide member relative to the first slide member.

11. The system of claim 1, further comprising a locking member coupled to the second slide member, wherein the locking member is operable by a user to lock the first slide member relative to the rack rail.

12. The system of claim 11, wherein the locking member comprises a lever, wherein the lever comprises a cam portion, wherein the cam portion is configured to force a pin against the rail when the lever is rotated.

13. The system of claim 1, further comprising a locking member, wherein the locking member is configured to be coupled to one of the first slide member, the second slide member, or the rack rail before either of the first or second slide members are installed in the rack.

14. The system of claim 1, further comprising a second latch coupled to the second slide member, wherein the second latch is configured to couple with the first slide member to inhibit movement of the second slide member relative to the second slide member.

15. The system of claim 14, further comprising a locking member coupled to the second latch, wherein the locking member is configured to lock the second slide member relative to the first slide member, wherein the locking member comprises a lever pivotally coupled to the second latch.

16. The system of claim 1, wherein the first slide member comprises a front end and a rear end, wherein the latch is coupled proximate the front end of the first slide member, wherein the system further comprises a rear latch coupled proximate the rear end of the first slide member.

17. The system of claim 1, wherein the first slide member is configured to couple to a left side of the rack, wherein the system further comprises a right slide member configured to couple to a right side of the rack.

18. The system of claim 1, wherein the cocking element is configured to cock the pin from an extended position to a retracted position when the cocking element is deflected by the rail by a predetermined amount.

19. The system of claim 1, wherein the latch comprises an element configured to hold the pin in a retracted position, wherein the element is configured to release the pin into an aperture of the rail when the element is deflected laterally by a side panel of the rack rail by a predetermined amount.

20. The system of claim 1, wherein the pin is retractable into the body of the slam latch.

21. The system of claim 1, wherein the pin is cylindrical.

* * * * *